United States Patent
Yang et al.

(10) Patent No.: US 8,689,075 B2
(45) Date of Patent: Apr. 1, 2014

(54) APPARATUS AND METHOD FOR MAPPING AND DEMAPPING SIGNALS IN A COMMUNICATION SYSTEM USING A LOW DENSITY PARITY CHECK CODE

(75) Inventors: Hyun-Koo Yang, Seoul (KR); Hong-Sil Jeong, Seoul (KR); Sung-Ryul Yun, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 106 days.

(21) Appl. No.: 13/435,723

(22) Filed: Mar. 30, 2012

(65) Prior Publication Data

US 2012/0254683 A1    Oct. 4, 2012

(30) Foreign Application Priority Data

Mar. 30, 2011 (KR) .................. 10-2011-0029128
Apr. 13, 2011 (KR) .................. 10-2011-0034481
Apr. 21, 2011 (KR) .................. 10-2011-0037531
Dec. 23, 2011 (KR) .................. 10-2011-0141033

(51) Int. Cl.
*H03M 13/00* (2006.01)

(52) U.S. Cl.
USPC ........................................... 714/752

(58) Field of Classification Search
None
See application file for complete search history.

(56) References Cited

U.S. PATENT DOCUMENTS

| | | | | |
|---|---|---|---|---|
| 8,370,729 B2* | 2/2013 | Ko et al. | .................. | 714/790 |
| 8,385,445 B2* | 2/2013 | Vitale et al. | .................. | 375/261 |
| 8,385,460 B2* | 2/2013 | Ko et al. | .................. | 375/295 |
| 8,432,881 B2* | 4/2013 | Ko et al. | .................. | 370/341 |
| 8,493,912 B2* | 7/2013 | Ko et al. | .................. | 370/328 |
| 8,503,551 B2* | 8/2013 | Ko et al. | .................. | 375/260 |
| 2004/0252725 A1 | 12/2004 | Sun et al. | | |
| 2005/0050435 A1 | 3/2005 | Kyung et al. | | |
| 2005/0149840 A1 | 7/2005 | Lee et al. | | |
| 2008/0270877 A1 | 10/2008 | Oh et al. | | |
| 2009/0122903 A1 | 5/2009 | Miyazaki et al. | | |
| 2010/0162073 A1 | 6/2010 | Myung et al. | | |
| 2010/0246719 A1* | 9/2010 | Ko et al. | .................. | 375/303 |
| 2010/0290561 A1* | 11/2010 | Ko et al. | .................. | 375/298 |
| 2011/0013718 A1* | 1/2011 | Ko et al. | .................. | 375/295 |
| 2011/0019753 A1* | 1/2011 | Ko et al. | .................. | 375/260 |

(Continued)

FOREIGN PATENT DOCUMENTS

| | | |
|---|---|---|
| EP | 2 178 214 | 4/2010 |
| WO | WO 2009/064134 | 5/2009 |
| WO | WO 2010/004382 | 1/2010 |

OTHER PUBLICATIONS

Michael Lunglmayr et al., "Optimized Mapping Schemes for LDPC Coded Higher Order Modulated QAM Transmission", Eurocast 2007, Feb. 12, 2007.

(Continued)

*Primary Examiner* — Guerrier Merant
(74) *Attorney, Agent, or Firm* — The Farrell Law Firm, P.C.

(57) ABSTRACT

An apparatus and method for mapping and demapping signals in a system using a Low Density Parity Check (LDPC) code are provided. In the method, LDPC codeword bits are written column-wise and read row-wise, substreams are generated by demultiplexing the read bits using a demultiplexing scheme, and bits included in each of the substreams are mapped to symbols on a signal constellation. The demultiplexing scheme is determined corresponding to a modulation scheme used in the signal transmitter, a length of the LDPC codeword, and a number of the substreams.

20 Claims, 17 Drawing Sheets

(56) References Cited

U.S. PATENT DOCUMENTS

| | | | |
|---|---|---|---|
| 2011/0026636 A1* | 2/2011 | Ko et al. | 375/295 |
| 2011/0044401 A1* | 2/2011 | Ko et al. | 375/295 |
| 2011/0122960 A1* | 5/2011 | Vitale et al. | 375/261 |
| 2011/0131464 A1* | 6/2011 | Ko et al. | 714/752 |
| 2011/0274204 A1* | 11/2011 | Ko et al. | 375/295 |
| 2011/0274211 A1* | 11/2011 | Ko et al. | 375/300 |
| 2011/0280327 A1* | 11/2011 | Ko et al. | 375/260 |
| 2011/0286535 A1* | 11/2011 | Ko et al. | 375/259 |
| 2011/0299628 A1* | 12/2011 | Ko et al. | 375/298 |
| 2011/0305300 A1* | 12/2011 | Ko | 375/298 |
| 2012/0257895 A1* | 10/2012 | Djordjevic et al. | 398/65 |
| 2013/0064314 A1* | 3/2013 | Ko et al. | 375/260 |
| 2013/0232394 A1* | 9/2013 | Ko et al. | 714/776 |

OTHER PUBLICATIONS

Yan Li et al., "Bit-Reliability Mapping in LDPC-Coded Modulation Systems", IEEE Communications Letters, vol. 9, No. 1, XP-001211457, Jan. 2005.

* cited by examiner

US 8,689,075 B2

APPARATUS AND METHOD FOR MAPPING AND DEMAPPING SIGNALS IN A COMMUNICATION SYSTEM USING A LOW DENSITY PARITY CHECK CODE

PRIORITY

This application claims priority under 35 U.S.C. §119(a) to Korean Patent Application Serial No. 10-2011-0029128, which was filed in the Korean Intellectual Property Office on Mar. 30, 2011, Korean Patent Application Serial No. 10-2011-0034481, which was filed in the Korean Intellectual Property Office on Apr. 13, 2011, Korean Patent Application Serial No. 10-2011-0037531, which was filed in the Korean Intellectual Property Office on Apr. 21, 2011, and Korean Patent Application Serial No. 10-2011-0141033, which was filed in the Korean Intellectual Property Office on Dec. 23, 2011, the content of each of which is incorporated herein by reference.

BACKGROUND OF THE INVENTION

1. Field of the Invention

The present invention relates to an apparatus and method for mapping and demapping signals in a system using a Low Density Parity Check (LDPC) code.

2. Description of the Related Art

In a communication system, link performance may be significantly degraded by noise, fading, and Inter-Symbol Interference (ISI) of a channel. Therefore, a future-generation communication system is actively considering using LDPC codes as error correction codes.

FIG. 1 illustrates a conventional LDPC encoding operation.

Referring to FIG. 1, an LDPC encoder 110 encodes an information word vector of length $K_{ldpc}$, $I=\{i_0, i_1, \ldots, i_{K_{ldpc}-1}\}$ to an LDPC codeword vector $\Lambda=\{i_0, i_1, \ldots, i_{K_{ldpc}-1}, \rho_0, \rho_1, \ldots, \rho_{N_{ldpc}-K_{ldpc}-1}\}$. The information word vector includes $K_{ldpc}$ information bits. That is, each element of the information word vector $I=\{i_0, i_1, \ldots i_{K_{ldpc}-1}\}$ is an information bit.

The LDPC encoder 110 generates a parity vector of length $N_{ldpc}-K_{ldpc}$, $\{\rho_0, \rho_1, \ldots, \rho_{N_{ldpc}-K_{ldpc}-1}\}$ using a parity check matrix having $N_{ldpc}$ columns, and generates the LDPC code, i.e., the LDPC codeword vector $\Lambda=\{i_0, i_1, \ldots, i_{K_{ldpc}-1}, \rho_0, \rho_1 \ldots, \rho_{N_{ldpc}-1}\}$, using the information word vector and the parity vector.

Along with growing demands for high-rate data transmission and hardware development, the future-generation communication system is actively considering using Quadrature Amplitude Modulation (QAM), which is excellent in terms of frequency efficiency. In QAM, different modulation bits included in one QAM symbol have different error probabilities.

The error correction ability of each LDPC codeword bit included in the LDPC codeword vector is determined according to the degree of a variable node corresponding to the LDPC codeword bit.

Consequently, even though the same LDPC code is used, the error probability of a QAM symbol varies depending on modulation bits of the QAM symbol, to which LDPC codeword bits are mapped. Accordingly, a need exists for a technique for mapping LDPC codeword bits to modulation bits of a QAM symbol, which minimizes the error probability of the QAM symbol.

SUMMARY OF THE INVENTION

Accordingly, embodiments of the present invention are designed to address at least the problems and/or disadvantages described above and to provide at least the advantages described below.

An aspect of the present invention is to provide an apparatus and method for mapping and demapping signals in a system using an LDPC code.

Another aspect of the present invention is to provide an apparatus and method for mapping and demapping between LDPC codewords and QAM symbols in a system using an LDPC code.

In accordance with an aspect of the present invention, a signal transmitter is provided for use in a system using an LDPC code. The signal transmitter includes an interleaver writes LDPC codeword bits column-wise and reads the written LDPC codeword bits row-wise, a demultiplexer generates substreams by demultiplexing the read bits using a demultiplexing scheme, and a symbol mapper maps bits included in each of the substreams to symbols on a signal constellation, The demultiplexing scheme is determined corresponding to a modulation scheme used in the signal transmitter, a length of the LDPC codeword, and a number of the substreams.

In accordance with another aspect of the present invention, a signal receiver is provided for use in a system using an LDPC code. The signal receiver includes a multiplexer multiplexes substreams using a multiplexing scheme, a deinterleaver deinterleaves the multiplexed bits, and an LDPC decoder generates LDPC codeword bits by LDPC-decoding the deinterleaved bits. The multiplexing scheme is determined corresponding to a demultiplexing scheme used in a signal transmitter, and the demultiplexing scheme is determined corresponding to a modulation scheme used in the signal transmitter, a length of an LDPC codeword, and a number of the substreams.

In accordance with another aspect of the present invention, a signal mapping method is provided for a signal transmitter in a system using an LDPC code. In the method, LDPC codeword bits are written column-wise and read row-wise, substreams are generated by demultiplexing the read bits using a demultiplexing scheme, and bits included in each of the substreams are mapped to symbols on a signal constellation. The demultiplexing scheme is determined corresponding to a modulation scheme used in the signal transmitter, a length of the LDPC codeword, and a number of the substreams.

In accordance with another aspect of the present invention, a signal demapping method is provided for a signal receiver in a system using an LDPC code. In the method, substreams are multiplexed using a multiplexing scheme, the multiplexed bits are deinterleaved, and LDPC codeword bits are generated by LDPC-decoding the deinterleaved bits. The multiplexing scheme is determined corresponding to a demultiplexing scheme used in a signal transmitter, and the demultiplexing scheme is determined corresponding to a modulation scheme used in the signal transmitter, a length of an LDPC codeword, and a number of the substreams.

BRIEF DESCRIPTION OF THE DRAWINGS

The above and other aspects, features, and advantages of certain embodiments of the present invention will become more apparent from the following detailed description taken in conjunction with the accompanying drawings, in which.

Throughout the drawings, the same drawing reference numerals will be understood to refer to the same elements, features, and structures.

DETAILED DESCRIPTION OF EMBODIMENTS OF THE INVENTION

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

In accordance with an embodiment of the present invention, an apparatus and method are provided for mapping and demapping signals in a system using an LDPC code.

In accordance with another embodiment of the present invention, an apparatus and method are provided for mapping and demapping between LDPC codewords and QAM symbols.

The following description of the present invention is provided for a system using LDPC codes, for example, a broadcasting system such as Digital Video Broadcasting (DVB)-Next Generation Handheld (NGH) or a communication system such as Moving Picture Experts Group (MPEG) Media Transport (MMT), Evolved Packet System (EPS), Long-Term Evolution (LTE), and Institute of Electrical and Electronics Engineers (IEEE) 802.16m.

While the present invention is described in the context of an LDPC code and QAM modulation schemes, it is to be clearly understood that the apparatus and method of the present invention are also applicable to other codes and other modulation schemes.

Figure 1:
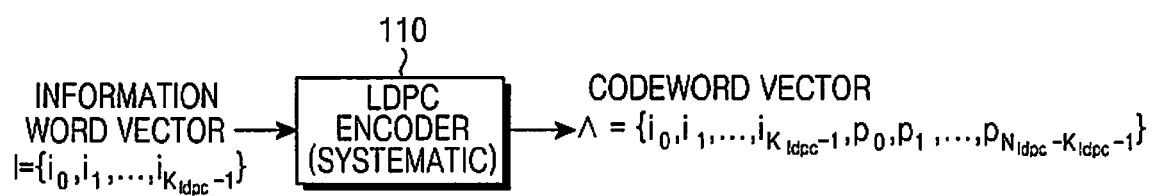
FIG. 1 illustrates a conventional LDPC encoding operation.
Figure 2:
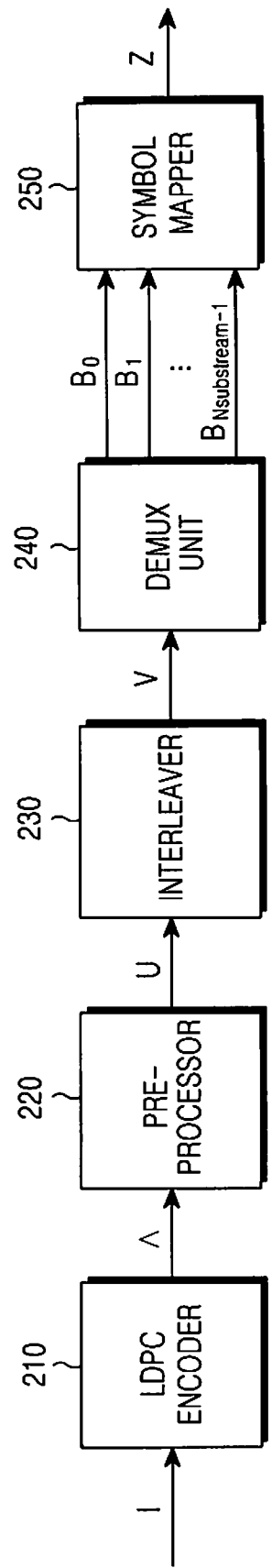
FIG. 2 is a block diagram illustrating a signal transmitter in a system using an LDPC code according to an embodiment of the present invention.

FIG. 2 is a block diagram illustrating a signal transmitter in a system using an LDPC code according to an embodiment of the present invention.

Referring to FIG. 2, the signal transmitter includes an LDPC encoder 210, a pre-processor 220, an interleaver 230, a DEMUX unit 240, and a symbol mapper 250.

The LDPC encoder 210 generates a parity vector $\{\rho_0, \rho_1, \ldots, \rho_{N_{ldpc}-K_{ldpc}-1}\}$ including $N_{ldpc}-K_{ldpc}$ parity bits and then an LDPC codeword vector of length $N_{ldpc}$ by encoding an information word vector $I=\{i_0, i_1, \ldots, i_{K_{ldpc}-1}\}$. The pre-processor 220 generates a vector $U=\{\mu_0, \mu_1, \ldots, \mu_{N_{ldpc}-1}\}$ by pre-processing the LDPC codeword vector Λ received from the LDPC encoder 210 using a predetermined pre-processing scheme. Alternatively, the pre-processor 220 may be omitted or its function may be incorporated into the interleaver 230. A detailed description of the pre-processing scheme is not provided herein.

The interleaver 230 writes the vector U received from the pre-processor 220 column-wise in Nc columns and reads the vector U row-wise, thus outputting a vector $V=\{v_0, v_1, \ldots, v_{N_{ldpc}-1}\}$ to the DEMUX UNIT 240. The DEMUX UNIT 240 demultiplexes the vector V into $N_{substreams}$ substreams $B_i=\{b_{i,0}, b_{i,1}, \ldots, b_{i,N_{ldpc}/N_{substreams}-1}\}$ (i=0, 1, \ldots, $N_{substreams}-1$) each having Nc bits. For the input of the bits of each of the $N_{substreams}$ substreams, the symbol mapper 250 generates a cell word of length η MOD, $\lceil y_0, y_1, \ldots y_{\mu MOD-1} \rceil$ and maps the cell word to signal points on a signal constellation, thereby producing a symbol Z. Herein η MOD is a divisor of $N_{substreams}$.

Figure 3:
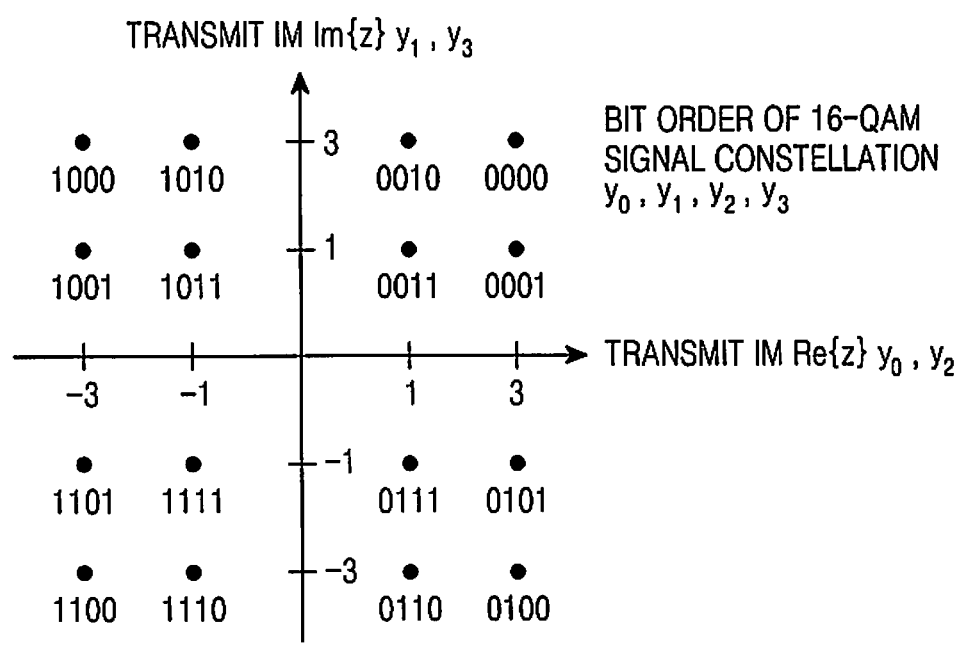
FIG. 3 illustrates a 16-ary QAM (16-QAM) signal constellation according to an embodiment of the present invention.
Figure 4:
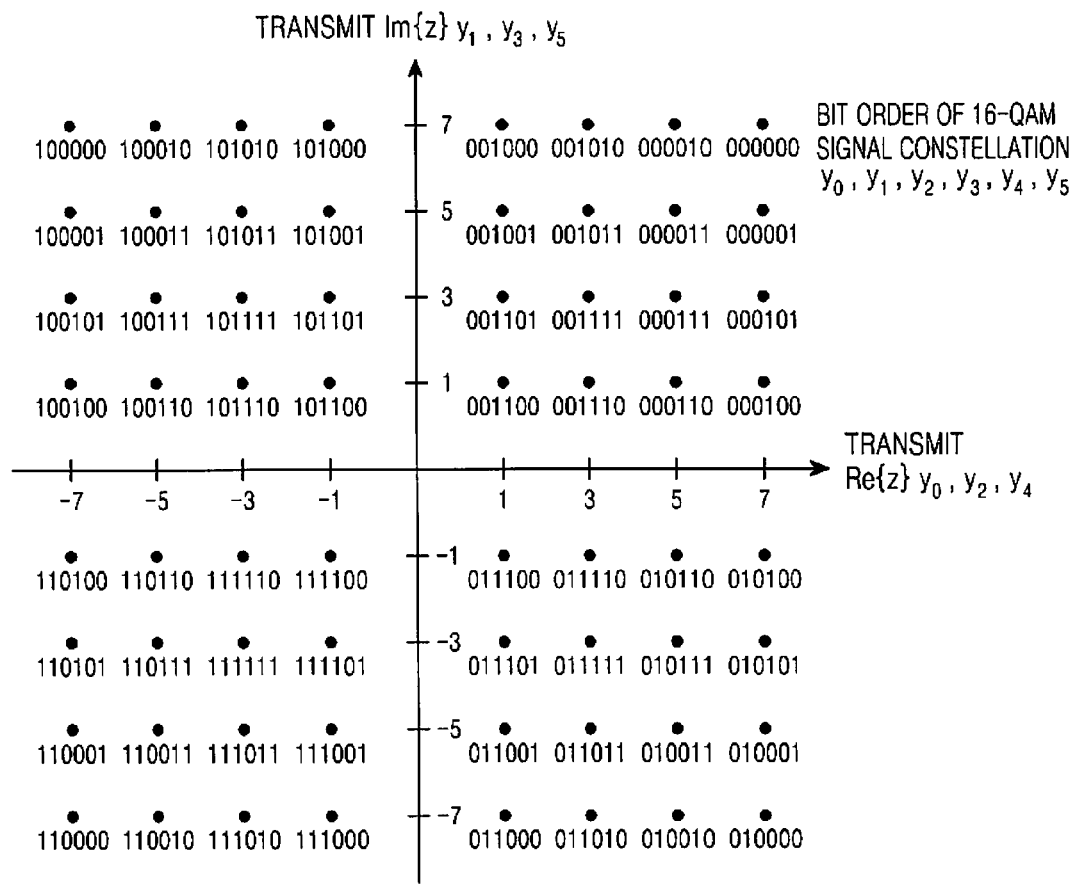
FIG. 4 illustrates a 64-ary QAM (64-QAM) signal constellation according to an embodiment of the present invention.
Figure 5A:
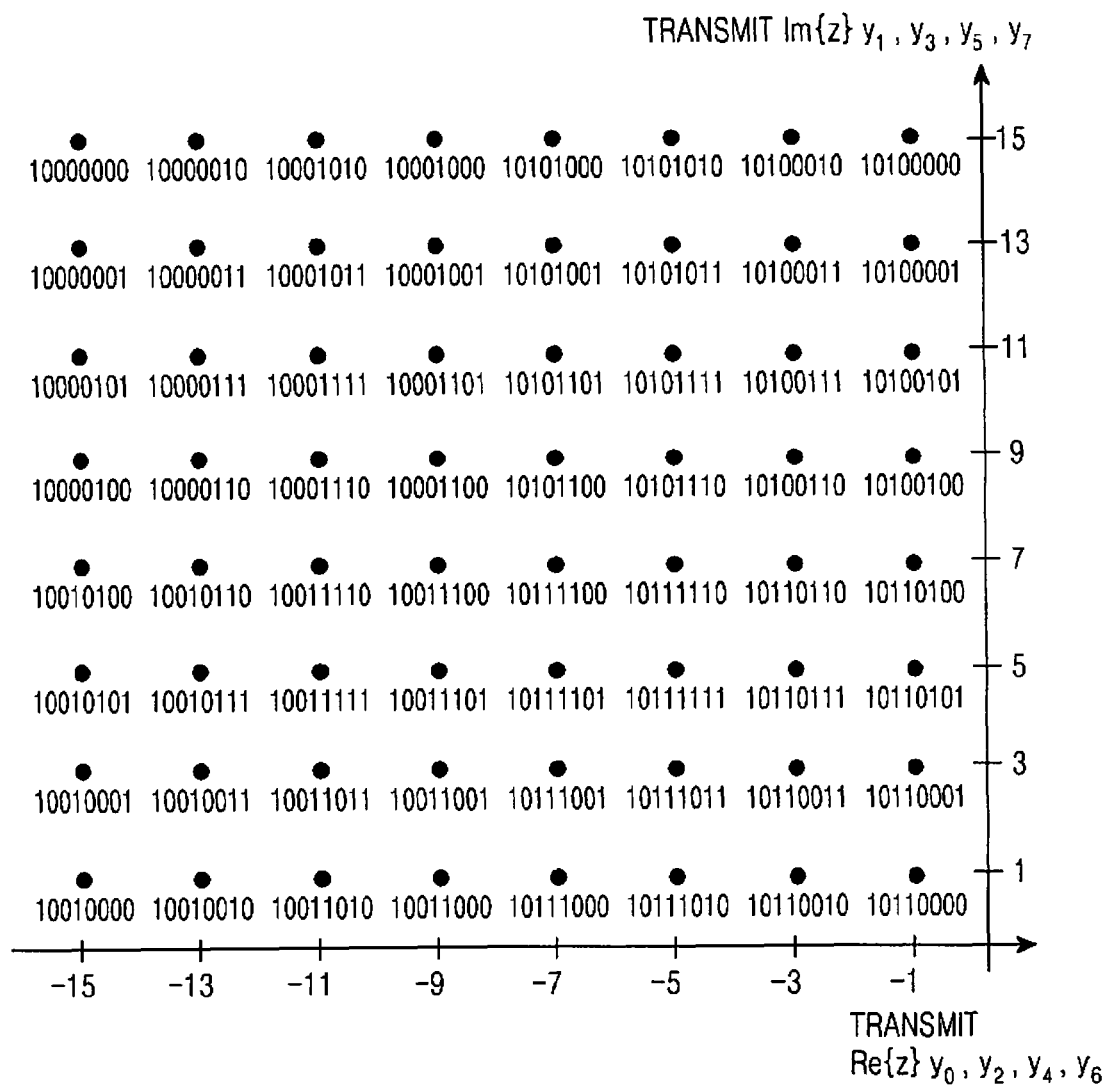
FIG. 5 illustrates a 256-ary QAM (256-QAM) signal constellation according to an embodiment of the present invention.
Figure 5B:
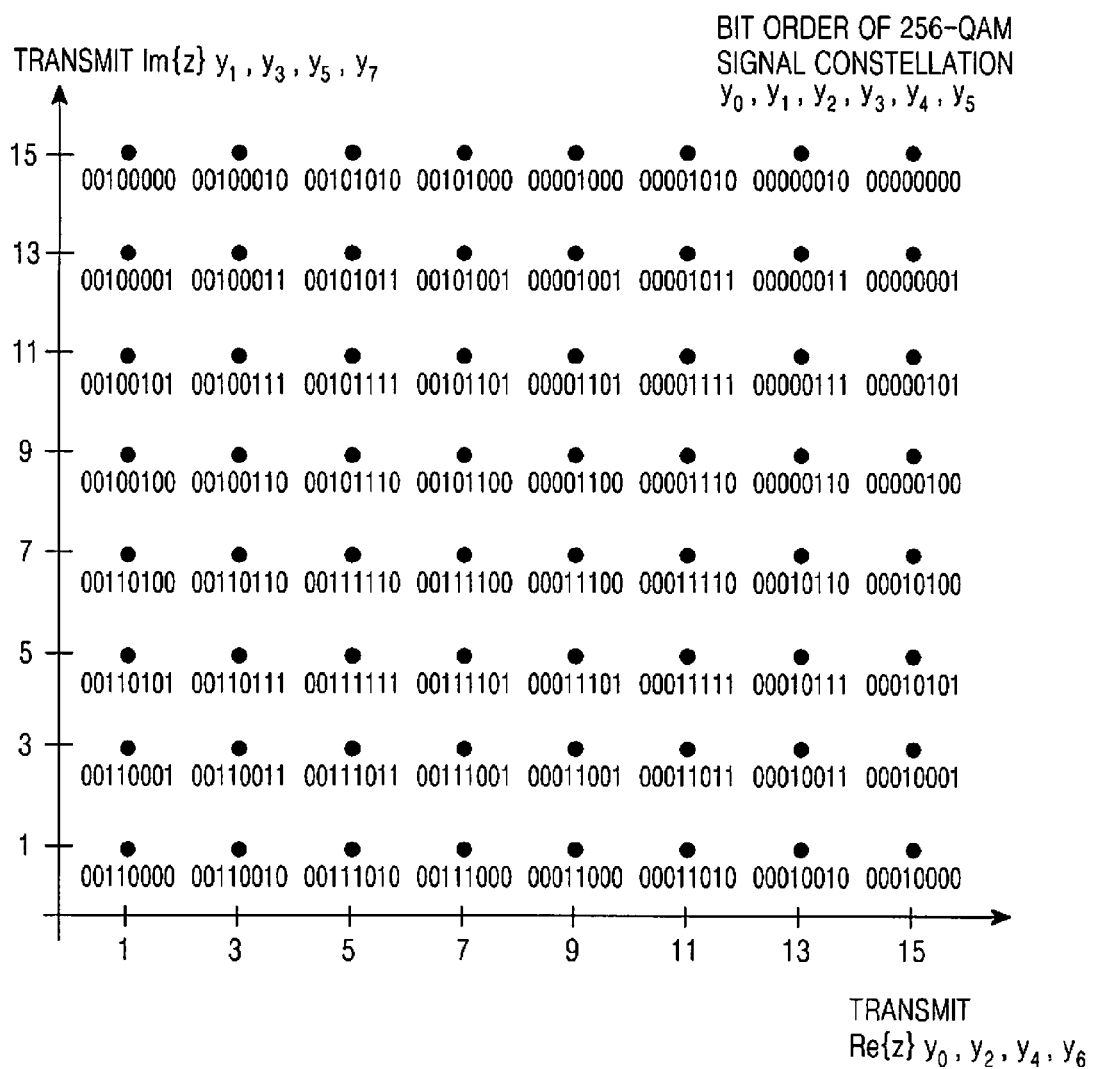
Figure 5C:
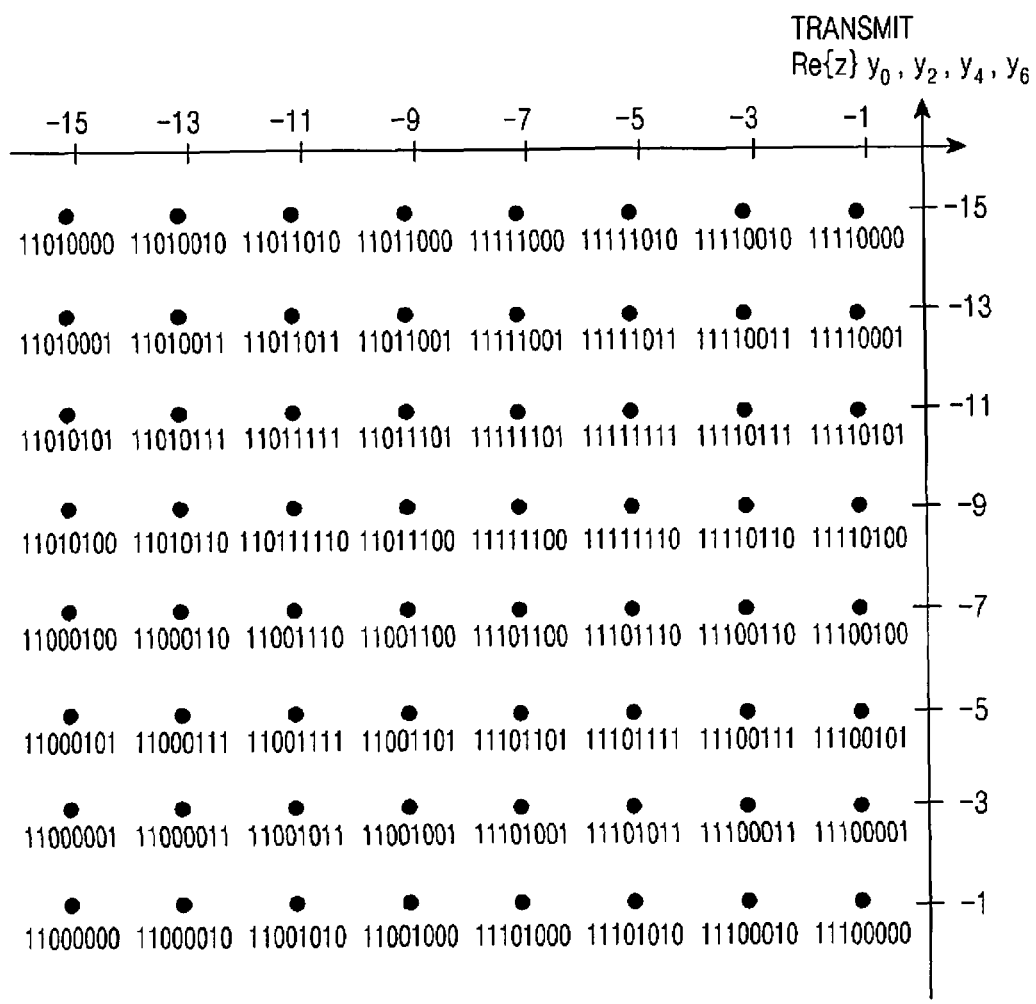
Figure 5D:
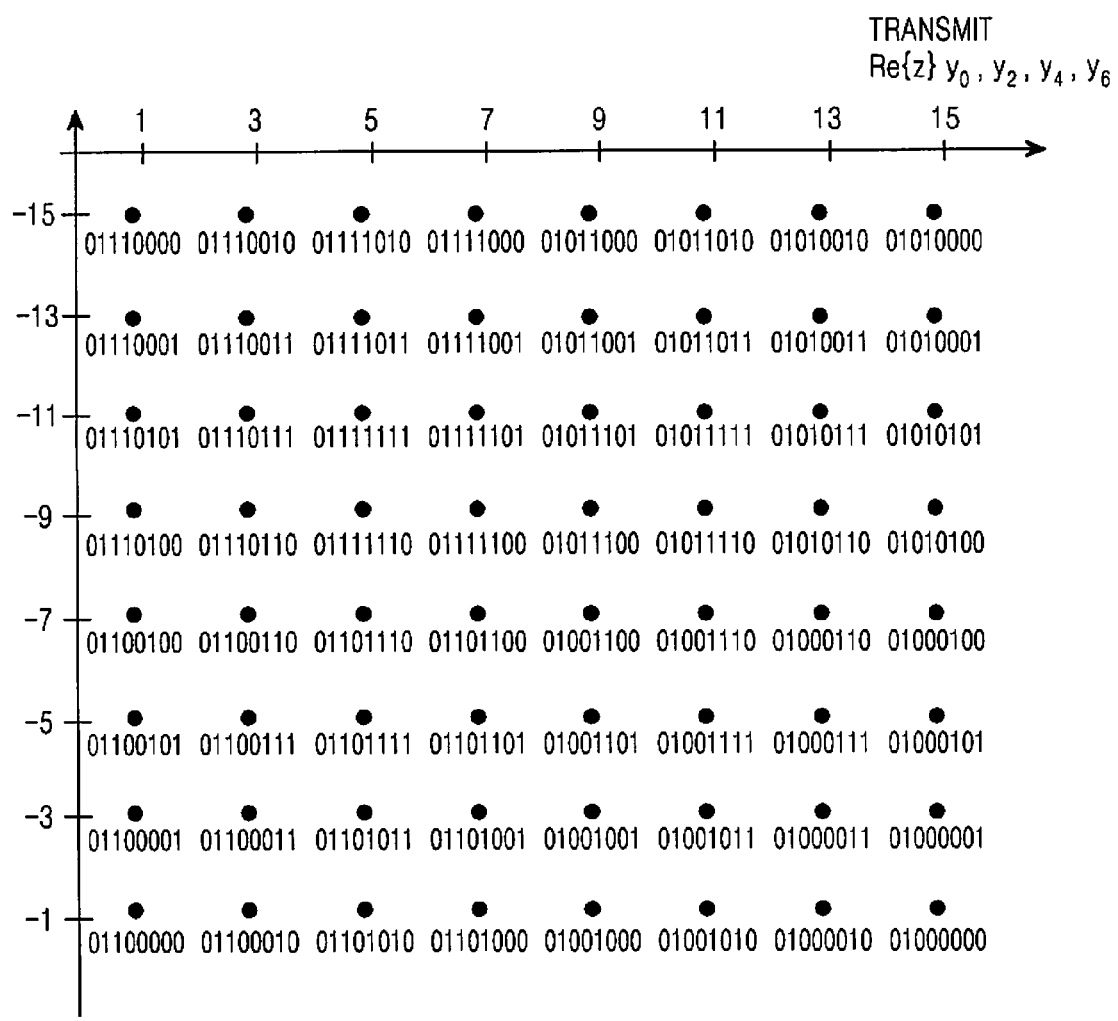

FIGS. 3, 4, and 5 illustrate mapping relationships between cell words and signal constellations in 16-QAM, 64-QAM, and 256-QAM, respectively, according to embodiments of the present invention.

Figure 6:
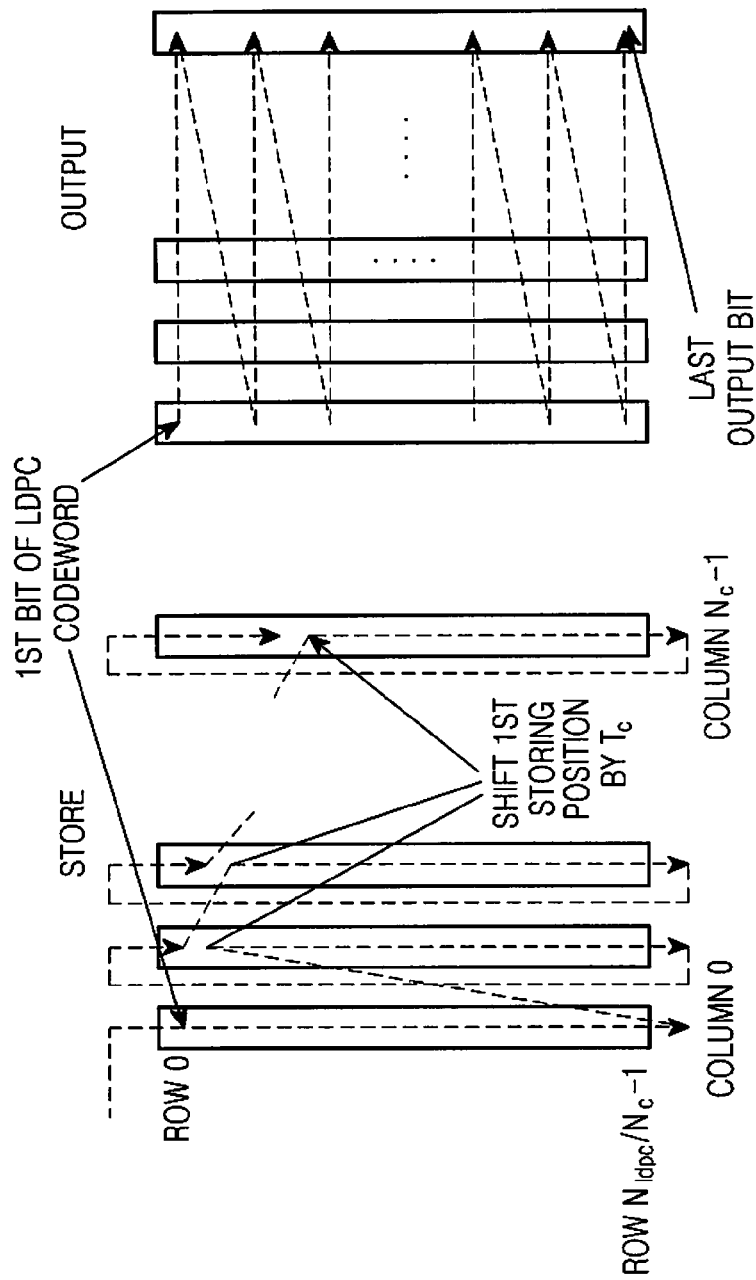
FIG. 6 illustrates an operation of an interleaver illustrated in FIG. 2 according to an embodiment of the present invention.

FIG. 6 illustrates an operation of the interleaver 230 illustrated in FIG. 2 according to an embodiment of the present invention. Specifically, in FIG. 6, it is assumed that the interleaver 230 has Nc rows×$N_{ldpc}$/Nc columns.

If $N_{ldpc}=16200$, the number of rows Nr and the number of columns Nc are given for 16-QAM and 64-QAM as shown in Table 1.

TABLE 1

| Modulation scheme | Nr | Nc |
|---|---|---|
| 16-QAM | 8100 | 8 |
| 64-QAM | 5400 | 12 |

The interleaver 230 sequentially writes the received vector U column-wise in Nc columns and reads the written vector row-wise. Herein, the first storing position of each column may be shifted by a twisting parameter tc. The twisting parameter tc may have the values shown in Table 2 for 16-QAM and 64-QAM, when $N_{ldpc}$=16200, for example.

TABLE 2

| Modulation scheme | Nc | Column 0 | 1 | 2 | 3 | 4 | 5 | 6 | 7 | 8 | 9 | 10 | 11 |
|---|---|---|---|---|---|---|---|---|---|---|---|---|---|
| 16-QAM | 8 | 0 | 0 | 0 | 1 | 7 | 20 | 20 | 21 | — | — | — | — |
| 64-QAM | 12 | 0 | 0 | 0 | 2 | 2 | 2 | 3 | 3 | 3 | 6 | 7 | 7 |

Figure 7:
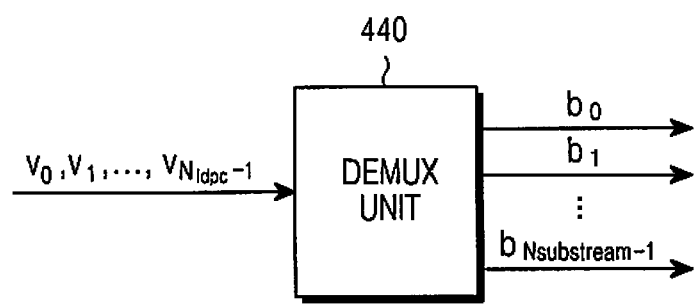
FIG. 7 illustrates an operation of a Demultiplexer (DE-MUX) unit illustrated in FIG. 102 according to an embodiment of the present invention.

FIG. 7 illustrates an operation of a DEMUX unit illustrated in FIG. 2 according to an embodiment of the present invention.

Referring to FIG. 7, the operation of the DEMUX UNIT 240 may be expressed as the relationship between Vi (i= 0, 1, . . . , $N_{ldpc}$−1) and bj (j=0, 1, . . . , $N_{substreams}$−1), which may be extended in the same rule, if $N_{ldpc}$, is a multiple of $N_{substreams}$.

Figure 8:
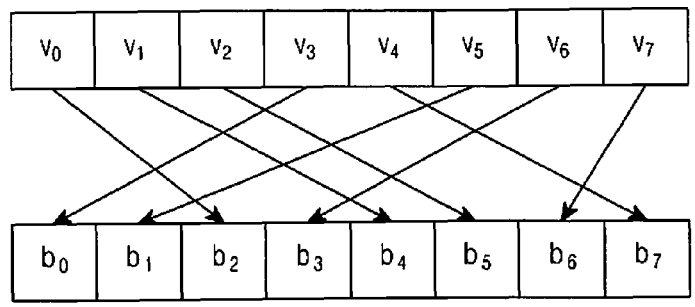
FIG. 8 illustrates an operation of the DEMUX unit, when $N_{ldpc}=16200$ and 16-QAM is used, according to an embodiment of the present invention.

FIG. 8 illustrates an operation of the DEMUX UNIT 240, when $N_{ldpc}$=16200 and 16-QAM is used, according to an embodiment of the present invention.

Referring to FIG. 8, assuming $N_{substreams}$=8, the DEMUX UNIT 240 maps input bits v0 to v7 to output bits b0 to b7. Specifically, the DEMUX UNIT 240 maps bit v0 to bit b2, bit v1 to b4, bit v2 to bit b5, bit v3 to bit b0, bit v4 to bit b7, bit v5 to bit b1, bit v6 to bit b3, and bit v7 to bit b6.

Figure 9:
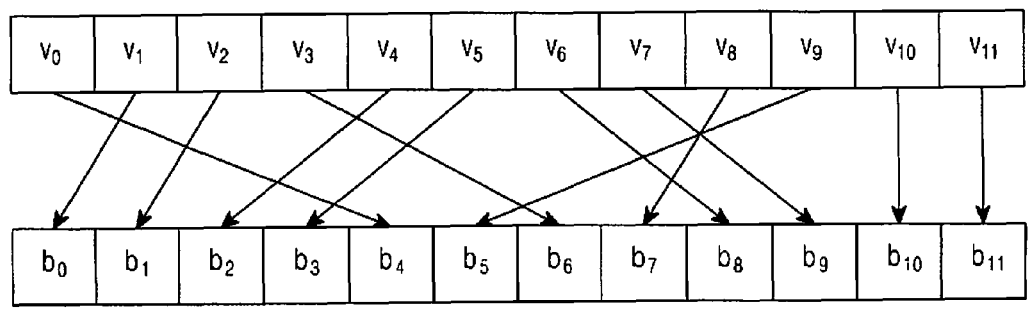
FIG. 9 illustrates an operation of the DEMUX unit, when $N_{ldpc}=16200$ and 64-QAM is used, according to an embodiment of the present invention.

FIG. 9 illustrates an operation of the DEMUX UNIT 240, when $N_{ldpc}$=16200 and 64-QAM is used, according to an embodiment of the present invention.

Referring to FIG. 9, assuming $N_{substreams}$=12, the DEMUX UNIT 240 maps input bits v0 to v11 to output bits b0 to b11. Specifically, the DEMUX UNIT 240 maps bit v0 to bit b4, bit v1 to b0, bit v2 to bit b1, bit v3 to bit b6, bit v4 to bit b2, bit v5 to bit b3, bit v6 to bit b8, bit v7 to bit b9, bit v8 to bit b7, bit v9 to bit b5, bit v10 to bit b10, and bit v11 to bit b11.

Figure 10:
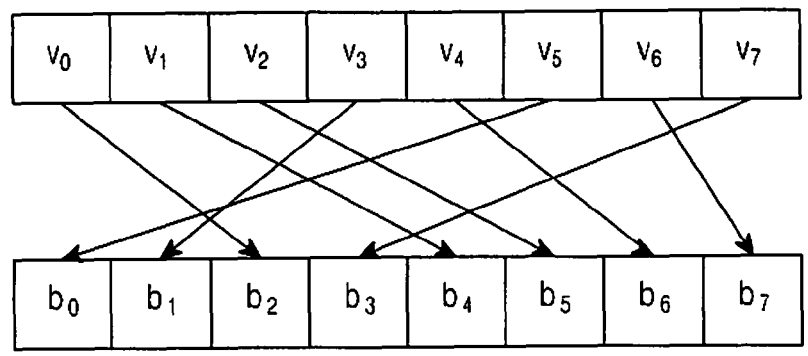
FIG. 10 illustrates another operation of the DEMUX unit, when $N_{ldpc}=16200$ and 16-QAM is used, according to an embodiment of the present invention.

FIG. 10 illustrates another operation of the DEMUX UNIT 240, when $N_{ldpc}$=16200 and 16-QAM is used, according to an embodiment of the present invention.

Referring to FIG. 10, assuming $N_{substreams}$=8, the DEMUX UNIT 240 maps input bits v0 to v7 to output bits b0 to b7. Specifically, the DEMUX UNIT 240 maps bit v0 to bit b2, bit v1 to b4, bit v2 to bit b5, bit v3 to bit b1, bit v4 to bit b6, bit v5 to bit b0, bit v6 to bit b7, and bit v7 to bit b3.

Figure 11:
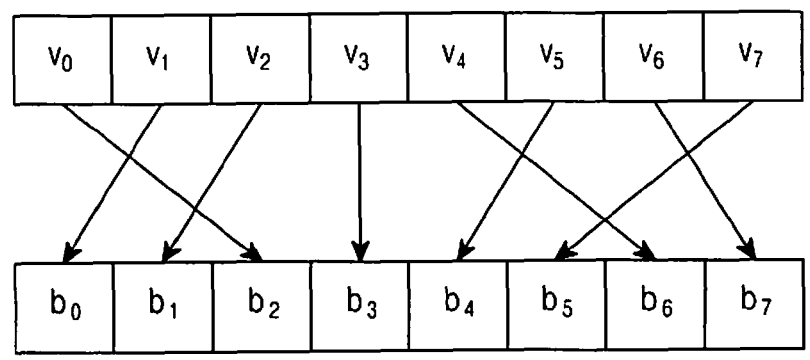
FIG. 11 illustrates another operation of the DEMUX unit, when $N_{ldpc}=16200$ and 16-QAM is used, according to an embodiment of the present invention.

FIG. 11 illustrates another operation of the DEMUX UNIT 240, when $N_{ldpc}$=16200 and 16-QAM is used, according to an embodiment of the present invention.

Referring to FIG. 11, assuming $N_{substreams}$=8, the DEMUX UNIT 240 maps input bits v0 to v7 to output bits b0 to b7. Specifically, the DEMUX UNIT 240 maps bit v0 to bit b2, bit v1 to b0, bit v2 to bit b1, bit v3 to bit b3, bit v4 to bit b6, bit v5 to bit b4, bit v6 to bit b7, and bit v7 to bit b5.

Figure 12:
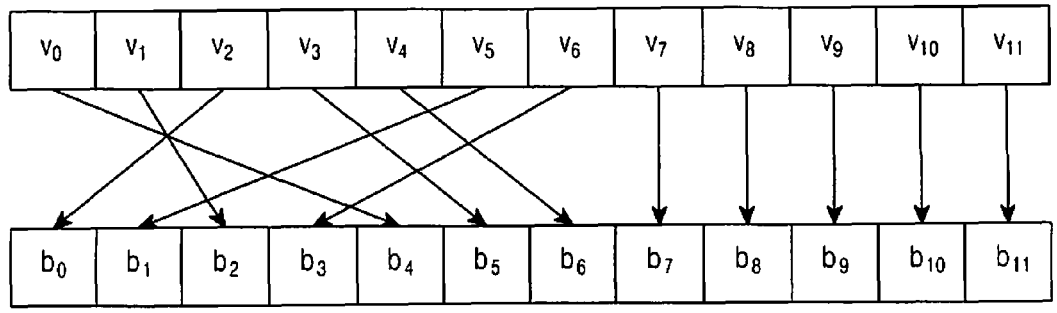
FIG. 12 illustrates another operation of the DEMUX unit, when $N_{ldpc}=16200$ and 64-QAM is used, according to an embodiment of the present invention.

FIG. 12 illustrates another operation of the DEMUX UNIT 240, when $N_{ldpc}$=16200 and 64-QAM is used, according to an embodiment of the present invention.

Referring to FIG. 12, assuming $N_{substreams}$=12, the DEMUX UNIT 240 maps input bits v0 to v11 to output bits b0 to b11. Specifically, the DEMUX UNIT 240 maps bit v0 to bit b4, bit v1 to b2, bit v2 to bit b0, bit v3 to bit b5, bit v4 to bit b6, bit v5 to bit b1, bit v6 to bit b3, bit v7 to bit b7, bit v8 to bit b8, bit v9 to bit b9, bit v10 to bit b10, and bit v11 to bit b11.

Figure 13:
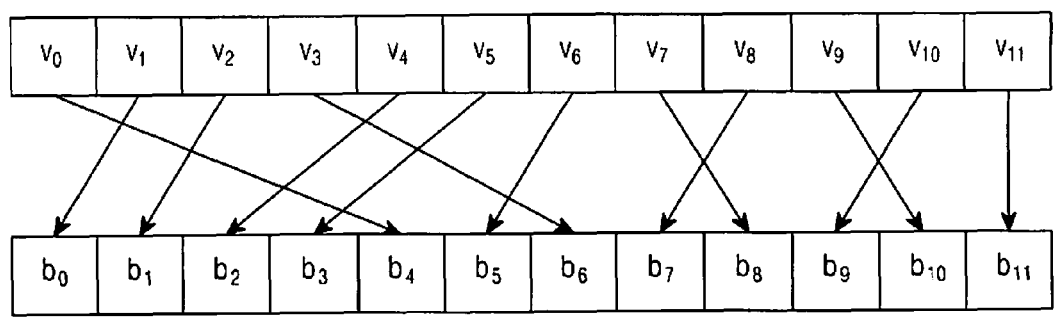
FIG. 13 illustrates another operation of the DEMUX unit, when $N_{ldpc}=16200$ and 64-QAM is used, according to an embodiment of the present invention.

FIG. 13 illustrates another operation of the DEMUX UNIT 240, when $N_{ldpc}$=16200 and 64-QAM is used, according to an embodiment of the present invention.

Referring to FIG. 13, assuming $N_{substreams}$=12, the DEMUX UNIT 240 maps input bits v0 to v11 to output bits b0 to b11. Specifically, the DEMUX UNIT 240 maps bit v0 to bit b4, bit v1 to b0, bit v2 to bit b1, bit v3 to bit b6, bit v4 to bit b2, bit v5 to bit b3, bit v6 to bit b5, bit v7 to bit b8, bit v8 to bit b7, bit v9 to bit b10, bit v10 to bit b9, and bit v11 to bit b11.

Figure 14:
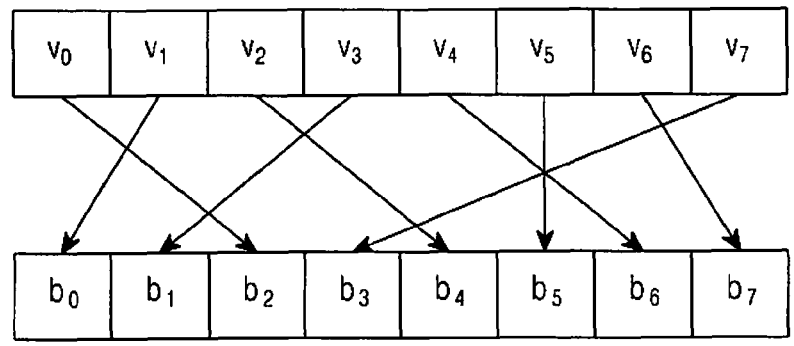
FIG. 14 illustrates a further operation of the DEMUX unit, when $N_{ldpc}=16200$ and 16-QAM is used, according to an embodiment of the present invention.

FIG. 14 illustrates another operation of the DEMUX UNIT 240, when $N_{ldpc}$=16200 and 64-QAM is used, according to an embodiment of the present invention.

Referring to FIG. 14, assuming $N_{substreams}$=8, the DEMUX UNIT 240 maps input bits v0 to v7 to output bits b0 to b7. Specifically, the DEMUX UNIT 240 maps bit v0 to bit b2, bit v1 to b0, bit v2 to bit b4, bit v3 to bit b1, bit v4 to bit b6, bit v5 to bit b5, bit v6 to bit b7, and bit v7 to bit b3.

Figure 15:
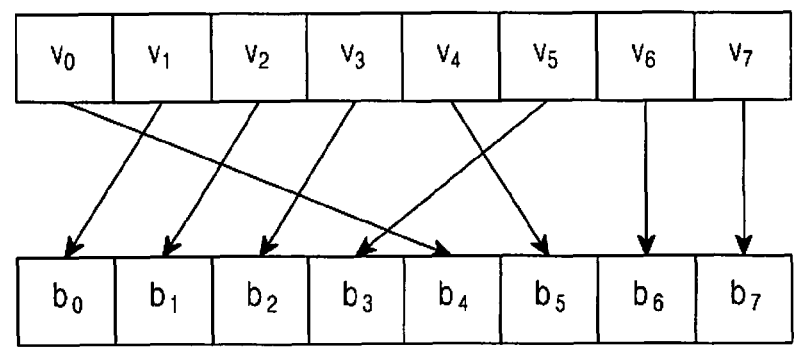
FIG. 15 illustrates an operation of the DEMUX unit, when $N_{ldpc}=16200$ and 256-QAM is used, according to an embodiment of the present invention.

FIG. 15 illustrates an operation of the DEMUX UNIT 240, when $N_{ldpc}$=16200 and 256-QAM is used, according to an embodiment of the present invention.

Referring to FIG. 15, assuming $N_{substreams}$=8, the DEMUX UNIT 240 maps input bits v0 to v7 to output bits b0 to b7. Specifically, the DEMUX UNIT 240 maps bit v0 to bit b4, bit v1 to b0, bit v2 to bit b1, bit v3 to bit b2, bit v4 to bit b5, bit v5 to bit b3, bit v6 to bit b6, and bit v7 to bit b7.

Figure 16:
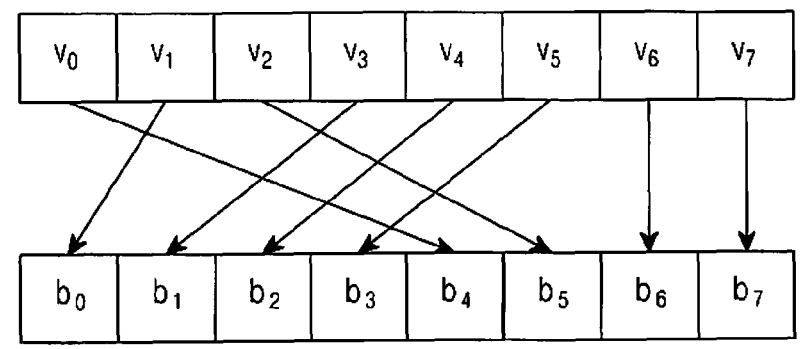
FIG. 16 illustrates an operation of the DEMUX unit, when $N_{ldpc}=16200$ and 256-QAM is used, according to an embodiment of the present invention.

FIG. 16 illustrates another operation of the DEMUX UNIT 240, when $N_{ldpc}$=16200 and 256-QAM is used, according to an embodiment of the present invention.

Referring to FIG. 16, assuming $N_{substreams}$=8, the DEMUX UNIT 240 maps input bits v0 to v7 to output bits b0 to b7. Specifically, the DEMUX UNIT 240 maps bit v0 to bit b4, bit v1 to b0, bit v2 to bit b5, bit v3 to bit b1, bit v4 to bit b2, bit v5 to bit b3, bit v6 to bit b6, and bit v7 to bit b7.

As described above, in accordance with the embodiments of the present invention, the DEMUX unit provides LDPC codeword bits to the symbol mapper according to a predetermined mapping rule. Therefore, when the LDPC codeword bits are mapped to symbols (e.g., symbols on a QAM signal constellation), the symbols have different performances according to different mapping rules.

Figure 17:
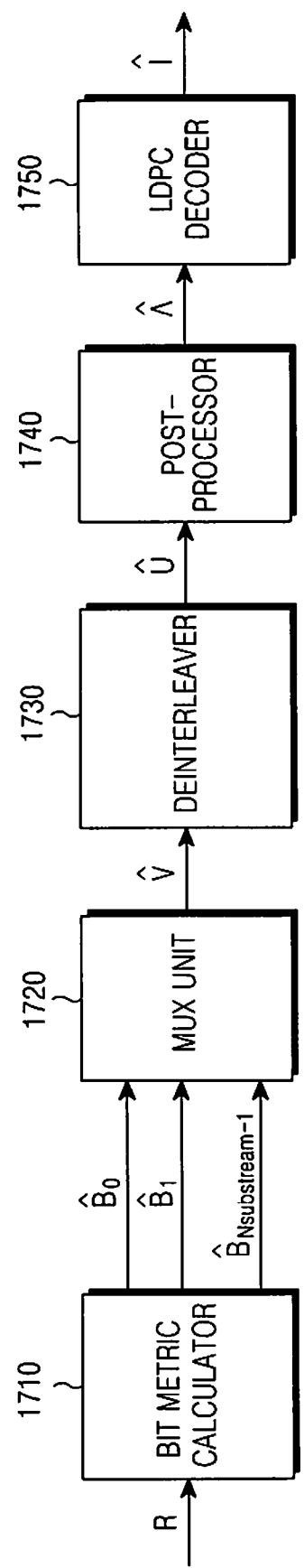
FIG. 17 is a block diagram illustrating a signal receiver in a system using an LDPC code, according to an embodiment of the present invention.

FIG. 17 is a block diagram illustrating a signal receiver in the system using the LDPC code, according to an embodiment of the present invention.

Referring to FIG. 17, the signal receiver includes a bit metric calculator 1710, a MUX unit 1720, a deinterleaver 1730, a post-processor 1740, and an LDPC decoder 1750.

Upon receipt of a symbol vector of length $N_{ldpc}/\eta$ MOD, $R=\{r_0, r_1, \ldots, r_{N_{ldpc}/\eta_{MOD}-1}\}$, the bit metric calculator 1710 calculates bit metric estimates $\hat{B}_i\{\hat{b}_{i,0}, \hat{b}_{i,1}, \ldots, \hat{b}_{i,N_{ldpc}/N_{substreams}-1}\}$ (i=0, 1, . . . , $N_{substreams}$−1) of $N_{substreams}$ substreams $B_i=\{b_{i,0}, b_{i,1}, \ldots, b_{i,N_{ldpc}/N_{substreams}-1}\}$ (i=

0, 1, ..., $N_{substreams}$−1). The bit metrics are used for decoding an LDPC code. For example, Log-Likelihood Ratios (LLRs) may be used as the bit metrics.

The MUX UNIT 1720 generates a bit metric vector estimate of length $N_{ldpc}$, $\hat{V}=\{\hat{v}_0, \hat{v}_1, \ldots, \hat{v}_{N_{ldpc}-1}\}$ by multiplexing the bit metric estimates $\hat{B}_i$, i=0, 1, ..., $N_{substreams}$−1 received from the bit metric calculator 1710. The deinterleaver 1730 deinterleaves the bit metric vector estimate $\hat{V}$ using a deinterleaving scheme corresponding to the interleaving scheme used in the signal transmitter, thereby producing a bit metric vector estimate $\hat{U}=\{\hat{\mu}_0, \hat{\mu}_1, \ldots, \hat{\mu}_{N_{ldpc}-1}\}$ of $U=\{\mu_0, \mu_1, \ldots, \mu_{N_{ldpc}-1}\}$.

The post-processor 1740 generates a bit metric vector estimate $\hat{\Lambda}\{\hat{i}_0, \hat{i}_1, \ldots \hat{i}_{K_{ldpc}-1}, \hat{\rho}_0, \hat{\rho}_1, \ldots \hat{\rho}_{N_{ldpc}-K_{ldpc}-1}\}$ of the transmitted LDPC codeword $\Lambda=\{i_0, i_1, \ldots i_{K_{ldpc}-1}, \rho_0, \rho_1, \ldots, \rho_{N_{ldpc}-K_{ldpc}-1}\}$ by processing the bit metric vector estimate $\hat{U}=\{\hat{\mu}_0, \hat{\mu}_1, \ldots \hat{\mu}_{N_{ldpc}-1}\}$ using a post-processing scheme corresponding to the pre-processing scheme used in the pre-processor of the signal transmitter, i.e., the pre-processor 220, as illustrated in FIG. 2. The LDPC decoder 1740 decodes the bit metric vector $\hat{\Lambda}$ by LDPC decoding, thereby generating an estimate $\hat{I}=\{\hat{i}_0, \hat{i}_1, \ldots, \hat{i}_{K_{ldpc}-1}\}$ of the information word vector $I=\{i_0, i_1, \ldots, i_{K_{ldpc}-1}\}$.

Figure 18:
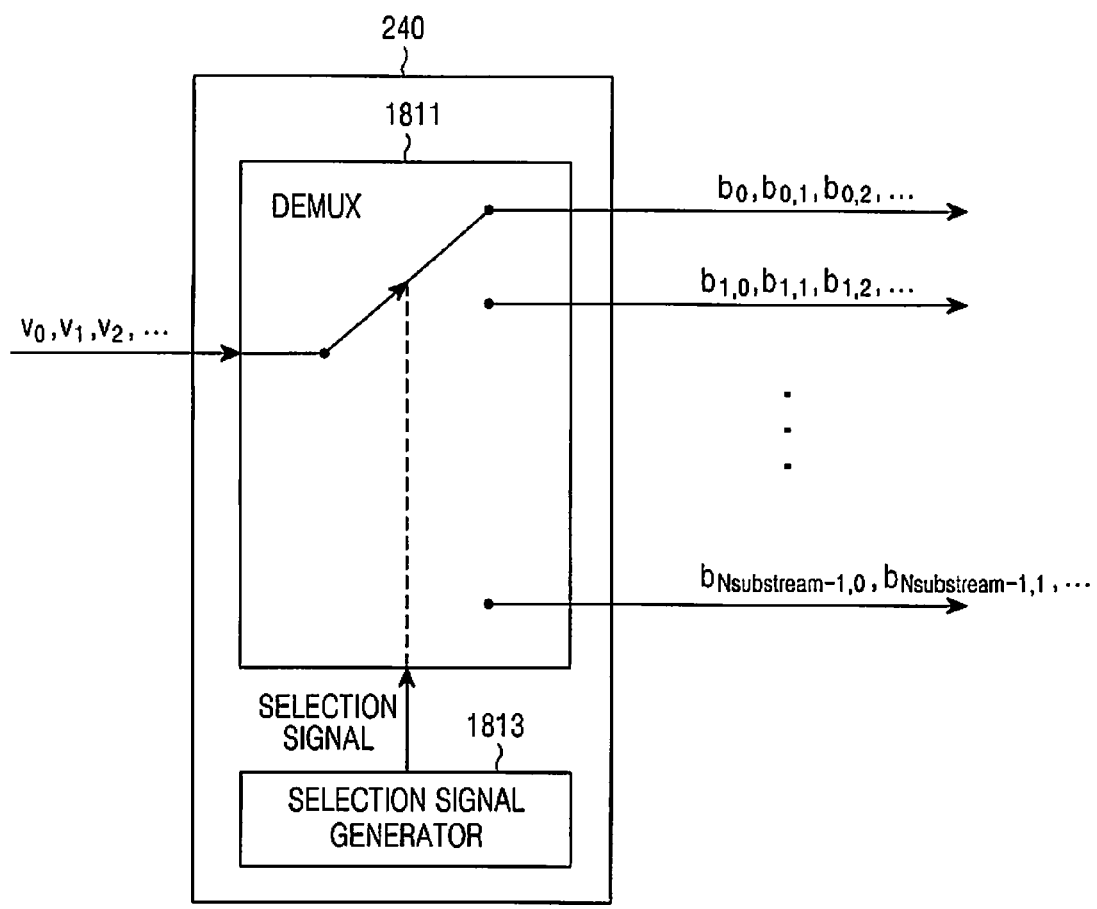
FIG. 18 is a block diagram illustrating the DEMUX unit illustrated in FIG. 2, according to an embodiment of the present invention.

FIG. 18 is a block diagram illustrating the DEMUX unit 240 illustrated in FIG. 2, according to an embodiment of the present invention.

Referring to FIG. 18, the DEMUX unit 240 includes a DEMUX 1811 and a selection signal generator 1813.

The DEMUX 1811 generates $N_{substreams}$ substreams from the vector V received from the interleaver 230 using selection signals received from the selection signal generator 1813. The selection signal generator 1813 determines a substream to which each bit of the vector V is to be allocated, and then outputs a selection signal by reading a value stored in a storage, for example, a memory, or generating a signal using a predetermined rule. The selection signal output from the selection signal generator 1813 is determined according to the type, codeword length, code rate, and modulation scheme of an error correction code used in the system. The selection signal is an important factor that affects the error correction capability of the system.

Figure 19:
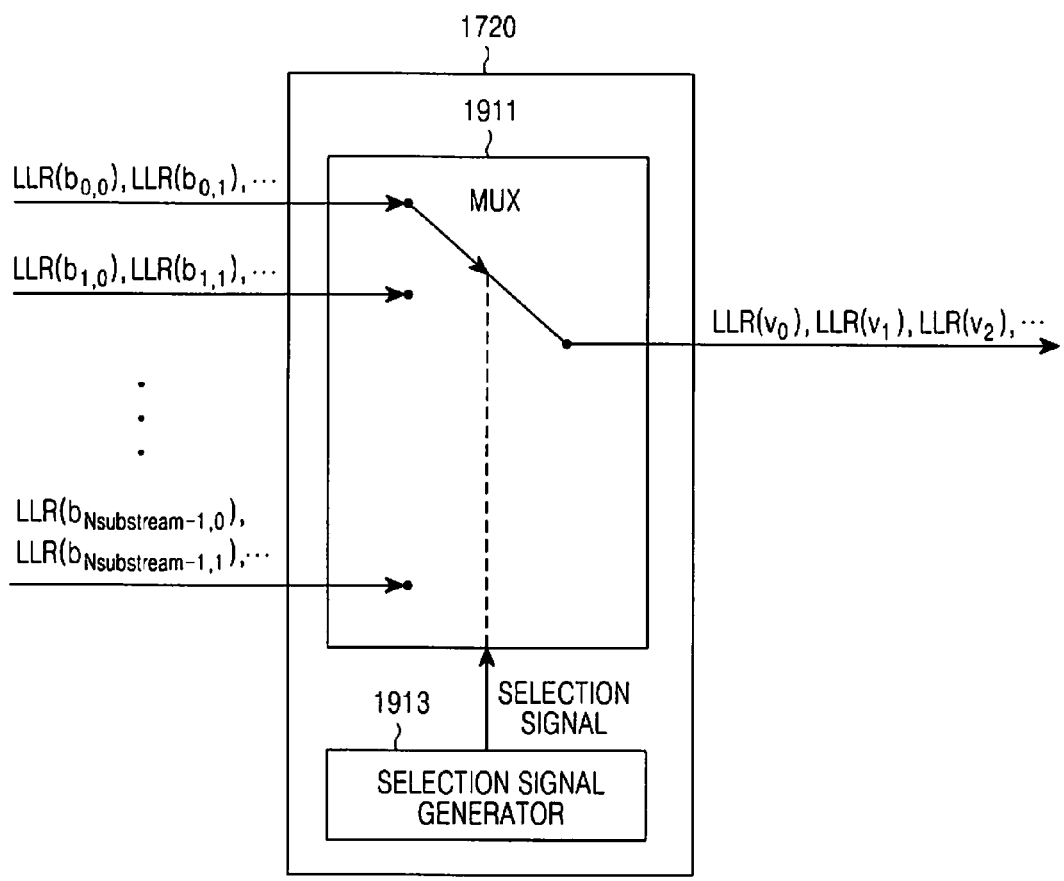
FIG. 19 is a block diagram illustrating a Multiplexer (MUX) unit illustrated in FIG. 17, according to an embodiment of the present invention.

FIG. 19 is a block diagram illustrating the MUX unit 1720 illustrated in FIG. 17, according to an embodiment of the present invention.

Referring to FIG. 19, the MUX unit 1720 includes a MUX 1911 and a selection signal generator 1913. The MUX 1911 outputs an estimate of an interleaved codeword from $N_{substreams}$ substreams using selection signals received from the selection signal generator 1913. The selection signal generator 1913 determines a substream from which each bit of an estimated interleaved codeword is obtained. The selection signal generator 1913 outputs a selection signal by reading a value stored in a memory or generating a signal using a predetermined rule. The MUX unit 1720 performs multiplexing using a manner corresponding to demultiplexing of the DEMUX unit 240 as illustrated in FIG. 2.

As is apparent from the description above, various embodiments of the present invention can minimize the error probability of a system using an LDPC code, and thus, improve overall system performance by enabling mapping of LDPC codeword bits to modulation symbols according to a used modulation scheme.

While the present invention has been particularly shown and described with reference to certain embodiments thereof, it will be understood by those of ordinary skill in the art that various changes in form and details may be made therein without departing from the spirit and scope of the present invention as defined by the following claims and their equivalents.

What is claimed is:

1. A signal mapping method of a signal transmitter in a system using a Low Density Parity Check (LDPC) code, the signal mapping method comprising:
   writing LDPC codeword bits column-wise;
   reading the written LDPC codeword bits row-wise;
   generating substreams by demultiplexing the read bits using a demultiplexing scheme; and
   mapping bits included in each of the substreams to symbols on a signal constellation,
   wherein the demultiplexing scheme is determined corresponding to a modulation scheme used in the signal transmitter, a length of the LDPC codeword, and a number of the substreams.

2. The signal mapping method of claim 1, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the read bits v0 to v11 are allocated to the 12 substreams b0 to b11, generating the substreams comprises allocating bit v0 to bit b4, bit v1 to b2, bit v2 to bit b0, bit v3 to bit b5, bit v4 to bit b6, bit v5 to bit b1, bit v6 to b3, bit v7 to bit b7, bit v8 to bit b8, bit v9 to bit b9, bit v10 to bit b10, and bit v11 to bit b11.

3. The signal mapping method of claim 1, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{subs}$=12), and the read bits v0 to v11 are allocated to the 12 substreams b0 to b11, generating the substreams comprises allocating bit v0 to bit b4, bit v1 to b0, bit v2 to bit b1, bit v3 to bit b6, bit v4 to bit b2, bit v5 to bit b3, bit v6 to b5, bit v7 to bit b8, bit v8 to bit b7, bit v9 to bit b10, bit v10 to bit b9, and bit v11 to bit b11.

4. The signal mapping method of claim 1, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substreams}$=8), and the read bits v0 to v7 are allocated to the 8 substreams b0 to b7, generating the substreams comprises allocating bit v0 to bit b4, bit v1 to b0, bit v2 to bit b1, bit v3 to bit b2, bit v4 to bit b5, bit v5 to bit b3, bit v6 to b6, and bit v7 to bit b7.

5. The signal mapping method of claim 1, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substreams}$=8), and the read bits v0 to v7 are allocated to the 8 substreams b0 to b7, generating the substreams comprises allocating bit v0 to bit b4, bit v1 to b0, bit v2 to bit b5, bit v3 to bit b1, bit v4 to bit b2, bit v5 to bit b3, bit v6 to b6, and bit v7 to bit b7.

6. A signal transmitter in a system using a Low Density Parity Check (LDPC) code, comprising:
   an interleaver for writing LDPC codeword bits column-wise and reading the written LDPC codeword bits row-wise;
   a demultiplexer for generating substreams by demultiplexing the read bits using a demultiplexing scheme; and
   a symbol mapper for mapping bits included in each of the substreams to symbols on a signal constellation, wherein the demultiplexing scheme is determined corresponding to a modulation scheme used in the signal transmitter, a length of the LDPC codeword, and a number of the substreams.

7. The signal transmitter of claim 6, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the read bits v0 to v11 are allocated to the 12 substreams b0 to b11, the demultiplexer allocates bit v0 to bit b4, bit v1 to b2, bit v2 to bit b0, bit v3 to bit b5, bit v4 to bit b6, bit v5 to bit b1, bit v6 to b3, bit v7 to bit b7, bit v8 to bit b8, bit v9 to bit b9, bit v10 to bit b10, and bit v11 to bit b11.

8. The signal transmitter of claim 6, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the read bits v0 to v11 are allocated to the 12 substreams b0 to b11, the demultiplexer allocates bit v0 to bit b4, bit v1 to b0, bit v2 to bit b1, bit v3 to bit b6, bit v4 to bit b2, bit v5 to bit b3, bit v6 to b5, bit v7 to bit b8, bit v8 to bit b7, bit v9 to bit b10, bit v10 to bit b9, and bit v11 to bit b11.

9. The signal transmitter of claim 6, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substreams}$=8), and the read bits v0 to v7 are allocated to the 8 substreams b0 to b7, the demultiplexer allocates bit v0 to bit b4, bit v1 to b0, bit v2 to bit b1, bit v3 to bit b2, bit v4 to bit b5, bit v5 to bit b3, bit v6 to b6, and bit v7 to bit b7.

10. The signal transmitter of claim 6, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substreams}$=8), and the read bits v0 to v7 are allocated to the 8 substreams b0 to b7, the demultiplexer allocates bit v0 to bit b4, bit v1 to b0, bit v2 to bit b5, bit v3 to bit b1, bit v4 to bit b2, bit v5 to bit b3, bit v6 to b6, and bit v7 to bit b7.

11. A signal demapping method of a signal receiver in a system using a Low Density Parity Check (LDPC) code, the signal demapping method comprising:
    multiplexing substreams using a multiplexing scheme;
    deinterleaving multiplexed bits from the multiplexed substreams; and
    generating LDPC codeword bits by LDPC-decoding the deinterleaved bits,
    wherein the multiplexing scheme is determined corresponding to a demultiplexing scheme used in a signal transmitter, and the demultiplexing scheme is determined corresponding to a modulation scheme used in the signal transmitter, a length of an LDPC codeword, and a number of the substreams.

12. The signal demapping method of claim 11, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the 12 substreams b0 to b11 are allocated to the multiplexed bits v0 to v11, multiplexing the substreams comprises allocating bit b0 to bit v2, bit b1 to bit v5, bit b2 to bit v1, bit b3 to bit v6, bit b4 to bit v0, bit b5 to bit v3, bit b6 to bit v4, bit b7 to bit v7, bit b8 to bit v8, bit b9 to bit v9, bit b10 to bit v10, and bit b11 to bit v11.

13. The signal demapping method of claim 11, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the 12 substreams b0 to b11 are allocated to the multiplexed bits v0 to v11, multiplexing the substreams comprises allocating bit b0 to bit v1, bit b1 to bit v2, bit b2 to bit v4, bit b3 to bit v5, bit b4 to bit v0, bit b5 to bit v6, bit b6 to bit v3, bit b7 to bit v8, bit b8 to bit v7, bit b9 to bit v10, bit b10 to bit v9, and bit b11 to bit v11.

14. The signal demapping method of claim 11, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams, $N_{substreams}$ is 8 ($N_{substreams}$=8), and the 8 substreams b0 to b8 are allocated to the multiplexed bits v0 to v8, multiplexing the substreams comprises allocating bit b0 to bit v1, bit b1 to bit v2, bit b2 to bit v3, bit b3 to bit v5, bit b4 to bit v0, bit b5 to bit v4, bit b6 to bit v6, and bit b7 to bit v7.

15. The signal demapping method of claim 11, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substream}$=8), and the 8 substreams b0 to b8 are allocated to the multiplexed bits v0 to v8, multiplexing the substreams comprises allocating bit b0 to bit v1, bit b1 to bit v3, bit b2 to bit v4, bit b3 to bit v5, bit b4 to bit v0, bit b5 to bit v2, bit b6 to bit v6, and bit b7 to bit v7.

16. A signal receiver in a system using a Low Density Parity Check (LDPC) code, comprising:
    a multiplexer for multiplexing substreams using a multiplexing scheme;
    a deinterleaver for deinterleaving multiplexed bits from the multiplexed substreams; and
    an LDPC decoder for generating LDPC codeword bits by LDPC-decoding the deinterleaved bits,
    wherein the multiplexing scheme is determined corresponding to a demultiplexing scheme used in a signal transmitter, and the demultiplexing scheme is determined corresponding to a modulation scheme used in the signal transmitter, a length of an LDPC codeword, and a number of the substreams.

17. The signal receiver of claim 16, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the 12 substreams b0 to b11 are allocated to the multiplexed bits v0 to v11, the multiplexer allocates bit b0 to bit v2, bit b1 to bit v5, bit b2 to bit v1, bit b3 to bit v6, bit b4 to bit v0, bit b5 to bit v3, bit b6 to bit v4, bit b7 to bit v7, bit b8 to bit v8, bit b9 to bit v9, bit b10 to bit v10, and bit b11 to bit v11.

18. The signal receiver of claim 16, wherein if 64-ary Quadrature Amplitude Modulation (64-QAM) is used as the modulation scheme, the length of the LDPC codeword $N_{ldpc}$ is 16200 ($N_{ldpc}$=16200), the number of the substreams $N_{substreams}$ is 12 ($N_{substreams}$=12), and the 12 substreams b0 to b11 are allocated to the multiplexed bits v0 to v11, the multiplexer allocates bit b0 to bit v1, bit b1 to bit v2, bit b2 to bit v4, bit b3 to bit v5, bit b4 to bit v0, bit b5 to bit v6, bit b6 to bit v3, bit b7 to bit v8, bit b8 to bit v7, bit b9 to bit v10, bit b10 to bit v9, and bit b11 to bit v11.

19. The signal receiver of claim 16, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substreams}$=8), and the 8 substreams b0 to b8 are allocated to the multiplexed bits v0 to v8, the multiplexer allocates bit b0 to bit v1, bit b1 to bit v2, bit b2 to bit v3, bit b3 to bit v5, bit b4 to bit v0, bit b5 to bit v4, bit b6 to bit v6, and bit b7 to bit v7.

20. The signal receiver of claim 16, wherein if 256-ary Quadrature Amplitude Modulation (256-QAM) is used as the modulation scheme, the length of the LDPC codeword $N_{ldpc}$ is 16200 ($N_{ldpc}$=16200), the number of the substreams $N_{substreams}$ is 8 ($N_{substreams}$=8), and the 8 substreams b0 to b8 are allocated to the multiplexed bits v0 to v8, the multiplexer allocates bit b0 to bit v1, bit b1 to bit v3, bit b2 to bit v4, bit b3 to bit v5, bit b4 to bit v0, bit b5 to bit v2, bit b6 to bit v6, and bit b7 to bit v7.

* * * * *